US009202770B1

(12) United States Patent
Foong et al.

(10) Patent No.: US 9,202,770 B1
(45) Date of Patent: Dec. 1, 2015

(54) NON-HOMOGENEOUS MOLDING OF PACKAGED SEMICONDUCTOR DEVICES (71) Applicants: Chee Seng Foong, Sg. Buloh (MY); Lan Chu Tan, Singapore (SG)

(72) Inventors: Chee Seng Foong, Sg. Buloh (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/474,291

(22) Filed: Sep. 1, 2014

(51) Int. Cl.
*H01L 23/367* (2006.01)
*H01L 21/56* (2006.01)
*B29B 9/12* (2006.01)

(52) U.S. Cl.
CPC .............. *H01L 23/3675* (2013.01); *B29B 9/12* (2013.01); *H01L 21/565* (2013.01)

(58) Field of Classification Search
None
See application file for complete search history.

(56) References Cited

U.S. PATENT DOCUMENTS

| 5,413,861 | A | 5/1995 | Gallo |
| 5,895,620 | A | 4/1999 | Nelissen |
| 5,904,955 | A * | 5/1999 | Goldstein et al. ........ 427/213.31 |
| 6,315,936 | B1 | 11/2001 | Black et al. |
| 6,815,525 | B2 | 11/2004 | DeBruin |
| 7,585,443 | B2 | 9/2009 | Luther |
| 8,062,424 | B2 | 11/2011 | Manikam et al. |
| 2013/0201650 | A1 | 8/2013 | Shen et al. |
| 2014/0264813 | A1* | 9/2014 | Lin et al. ....................... 257/690 |

FOREIGN PATENT DOCUMENTS

EP    0771642    5/1997

* cited by examiner

*Primary Examiner* — Daniel Whalen
*Assistant Examiner* — Aneta Cieslewicz
(74) *Attorney, Agent, or Firm* — Charles Bergere (57) ABSTRACT

A packaged semiconductor device has an integrated circuit (IC) die and first and second volumes of molding compound. The first volume of molding compound is disposed on a first portion of a first side of the IC die and comprises a first molding compound. The second volume of molding compound is disposed on a second side of the IC die, different from the first side, and comprises a second molding compound, different from the first molding compound. By including different molding compounds, the properties of the packaged semiconductor device can be varied across the device.

9 Claims, 6 Drawing Sheets

NON-HOMOGENEOUS MOLDING OF PACKAGED SEMICONDUCTOR DEVICES

BACKGROUND

The present invention relates generally to semiconductor packaging, and more particularly, to encapsulation of and dissipation of heat in packaged semiconductor devices.

With the miniaturization of integrated circuits, heat removal has become more important. If heat is not adequately dissipated from an integrated circuit (IC) die, then the IC die could overheat, resulting in decreased performance and possibly even failure.

Several techniques have been used to help dissipate heat from packaged semiconductor devices. In one such technique, a packaged semiconductor device is implemented with a heat spreader. In general, a heat spreader is a metal body that disperses heat emitted from an IC die to an area of the package that is away from the IC die. In another technique, a packaged semiconductor device is encapsulated in a single, homogeneous molding compound having a relatively high thermal conductivity that facilitates heat transfer away from the IC die. The high thermal conductivity is often achieved using, for example, alumina or other similar fillers having a high thermal conductivity coefficient.

Encapsulating packaged semiconductor devices in a single, homogeneous molding compound that has a high thermal conductivity has several disadvantages. For example, molding compounds having high thermal conductivities tend to be relatively expensive compared to molding compounds having lower thermal conductivities. As another example, molding compounds having high thermal conductivities tend to have relatively high viscosities, which may cause problems during molding such as wire sweep (i.e., movement of the bond wires, which may ultimately lead to wires shorting together). As yet another example, molding compounds having high thermal conductivities tend to have a relatively high elastic modulus, which may result in cracking of the integrated circuit (IC) die at the perimeter edges of the IC die when external forces are applied to the packaged semiconductor device. Accordingly, it would be advantageous to have a more economical and reliable way to package IC dies that are more resistant to damage.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

In the following description, it will be understood that certain embodiments of the present invention are related to packaged semiconductor devices that are encapsulated using two or more different molding compounds. For ease of discussion, the encapsulation of two exemplary packaged semiconductor devices using exemplary molding compound pellets are described below. However, it will be understood that embodiments of the present invention are not limited to the particular packaged semiconductor devices or molding compound pellets described below.

One embodiment of the present invention is a packaged semiconductor device comprising an IC die and first and second volumes of molding compound. The first volume of molding compound is disposed on at least a first portion of a first side of the IC die and comprises a first molding compound. The second volume of molding compound is disposed on a second side of the IC die, different from the first side, and comprises a second molding compound, different from the first molding compound.

Another embodiment of the present invention is a method for assembling a packaged semiconductor device. A partially-assembled packaged semiconductor device comprising an IC die is positioned within a mold cavity, and a molding compound pellet is positioned within a pot. The molding compound pellet comprises a first molding compound and second molding compound, different from the first molding compound. The second molding compound is pushed into a second volume of the mold cavity disposed on a second side of the IC die, and the first molding compound is pushed into a volume of the mold cavity disposed on at least a first portion of a first side of the IC die, different from the second side.

Yet another embodiment of the present invention is a molding compound pellet comprising first and second regions. The first region comprises a first molding compound. The second region comprises a second molding compound, different from the first molding compound, and a recess. The first region is located within the recess of the second region.

Figure 1:
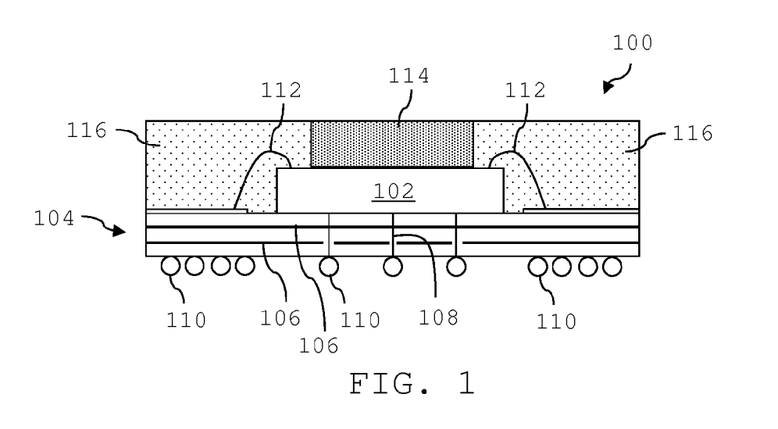
FIG. 1 shows a cross-sectional side view of a packaged semiconductor device according to one embodiment of the present invention.

FIG. 1 shows a cross-sectional side view of a packaged semiconductor device 100 according to one embodiment of the present invention. In this embodiment, the packaged semiconductor device 100 comprises an IC die 102 mounted onto a substrate 104. The substrate comprises a plurality of metal traces 106 and metal-filled vias 108 formed therein. The IC die 102 is electrically connected to a plurality of solder balls 110 formed on the lower surface of the substrate 104 via a plurality of bond wires 112 and the plurality of metal traces 106 and metal-filled vias 108. Methods of fabricating the IC die 102 and the substrate 104 and methods of assembling the IC die 102, the bond wires 112, and the substrate 104 are well known and therefore not described herein.

The packaged semiconductor device 100 is encapsulated in two different molding compounds 114 and 116. The first molding compound 114 is disposed on the upper surface of the IC die 102, and covers a first portion of the upper surface of the IC die 102. In this embodiment, the first portion lies within a perimeter of the upper surface of the IC die 102, and more specifically, between the bond-wire bond pads (not shown) on the periphery of the upper surface of the IC die 102. The first molding compound 114 may be any suitable shape, including (without limitation) a cylinder or box.

The first molding compound 114 has a relatively high thermal conductivity to facilitate heat transfer from the upper surface of the IC die 102 to the ambient environment outside of the packaged semiconductor device 100. In at least some embodiments of the present invention, the first molding compound 114 comprises alumina or other similar fillers having relatively high thermal conductivity coefficients to increase the thermal conductivity of the molding compound 114.

The second molding compound 116 encapsulates (i) the exposed portions of the IC die 102 that are not covered by the first molding compound 114, including the bond-wire bond pads (not shown) on the upper surface of the IC die 102, (ii) the bond wires 112, and (iii) the exposed portions of the upper surface of the substrate 104.

The second molding compound 116 has a thermal conductivity that is lower than the thermal conductivity of the first molding compound 114. Accordingly, the second molding compound 116 may have a smaller quantity of thermally-conductive fillers, fillers that have a lower thermal conductivity than those of the first molding compound 114, or no thermally-conductive fillers at all. Further, the second molding compound 116 has a lower elastic modulus than the first molding compound 114, meaning that the second molding compound 116 is less resistant to deformation when a force is applied to it than the first molding compound 114. Yet further, when melted to the molding temperature, the second molding compound 116 has a lower viscosity than the first molding compound 114.

As described above, molding compound having a relatively high thermal conductivity tends to be relatively expensive. Therefore, by encapsulating only a portion of the packaged semiconductor device 100 in the more expensive, high thermal conductivity molding compound 114, and the rest of the device 100 in the less expensive, low thermal conductivity molding compound 116, the overall cost of the molding compound may be reduced.

Further, by encapsulating the bond wires in the second molding compound 116, which has a lower viscosity during molding than the first molding compound 114, the likelihood of wire sweep during molding may be reduced.

Yet further, by encapsulating the perimeter edges of the IC die in the second molding compound 116, which has a lower elastic modulus than the first molding compound 114, the likelihood that the IC die will crack at the IC die's perimeter edges when external forces are applied to the packaged semiconductor device 100 may be reduced.

Device 100 may be molded using a multi-stage molding process. For example, in a first stage, a mold pin (not shown) having the size and shape of the first molding compound 114 may be positioned against the upper surface of the IC die 102 to prevent the second molding compound 116 from bleeding into the area that is to be encapsulated by the first molding compound 114. With the mold pin in place, the second molding compound 116 may be dispensed onto the packaged semiconductor device 100 and cured. The mold pin may then be removed, leaving a cavity (not shown) having the size and shape of the first molding compound 114. In a second stage, the first molding compound 114 may then be dispensed into the cavity and cured.

Device 100 may also be molded by positioning a tube (not shown) on the upper surface of the IC die 102, wherein the tube has the dimensions of the outer perimeter of the first molding compound 114. Then, the first molding compound 114 can be dispensed into the tube and cured. After removing the tube, the second molding compound 116 can be dispensed and cured without the two molding compounds mixing.

In packaged semiconductor device 100, the first molding compound 114 is distinct from the second molding compound 116 (i.e., substantially no mixing of the first and second molding compounds 114 and 116 occurs). However, embodiments of the present invention are not so limited. As an example, consider FIG. 2.

Figure 2:
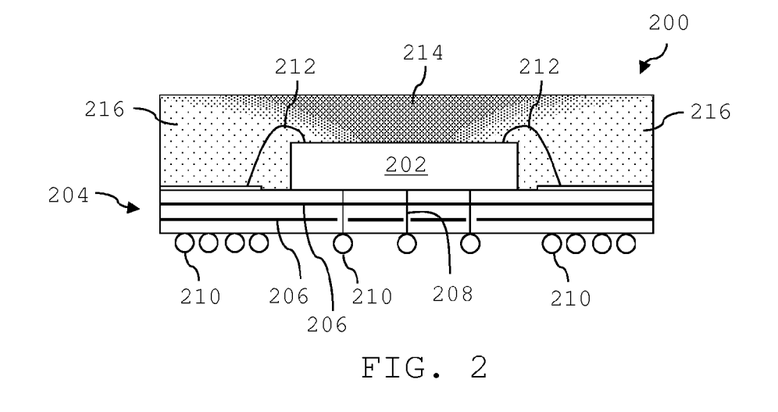
FIG. 2 shows a cross-sectional side view of a packaged semiconductor device according to another embodiment of the present invention.

FIG. 2 shows a cross-sectional side view of a packaged semiconductor device 200 according to another embodiment of the present invention. Packaged semiconductor device 200 has features 202 to 212, which are analogous to features 102 to 112 of FIG. 1, respectively. Packaged semiconductor device 200 is also encapsulated in first and second molding compounds 214 and 216, which are analogous to first and second molding compounds 114 and 116, respectively. However, unlike the molding compounds 114 and 116, which are distinct from one another, the molding compounds 214 and 216 are mixed in some locations of the device 200.

In particular, the concentration of the first molding compound 214 is highest in a substantially conical frustum-shaped section above the center of the upper surface of the IC die 202 where the shading is darkest. In this location, little, if any, mixing has occurred. The concentration of the first molding compound 214 decreases and the concentration of the second molding compound 216 increases away from the substantially conical frustum-shaped section of the first molding compound 214 until substantially only the second molding compound 216 is present (i.e., where the shading is the lightest). To further understand how the packaged semiconductor device 200 of FIG. 2 is molded, consider FIGS. 3A, 3B, and 4A to 4E.

Figure 3A:
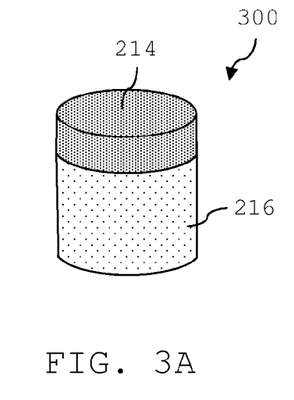
FIGS. 3A and 3B show perspective and cross-sectional side views, respectively, of a molding compound pellet according to one embodiment of the present invention.
Figure 3B:
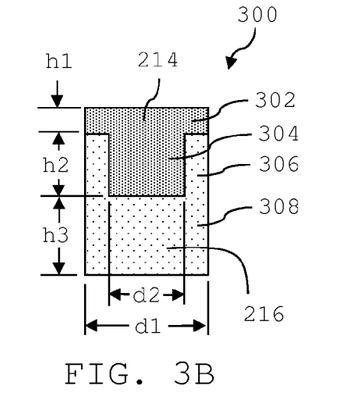

FIGS. 3A and 3B shows perspective and cross-sectional side views, respectively, of a molding compound pellet 300 according to one embodiment of the present invention that may be used to mold the packaged semiconductor device 200 of FIG. 2. Pellet 300 is substantially cylindrical and comprises first and second molding compounds 214 and 216. First molding compound 214 comprises an upper cylindrical portion 302 and an lower cylindrical portion 304. The upper cylindrical portion 302 has a diameter d1 and a height h1. The lower cylindrical portion 304 has a diameter d2, which is smaller than diameter d1, and a height h2.

The second molding compound 216 comprises an annular portion 306 and a cylindrical portion 308. The annular portion 306 has an outer diameter equal to diameter d1, an inner diameter equal to diameter d2, and a height equal to height h2. The cylindrical portion 308 has a diameter equal to diameter d1 and a height h3. The second cylindrical portion 304 of the first molding compound 214 is inside the annular portion 306 of the second molding compound 216.

In this embodiment, the heights h1 to h3 are each greater than zero. In alternative embodiments of the present invention, height h1 may be equal to zero and height h2 may be greater than zero such that the first molding compound 214 comprises the lower cylindrical portion 304 but not the upper cylindrical portion 302. In further embodiments of the present invention, height h1 may be greater than zero and height h2 may be equal to zero such that the first molding compound 214 comprises the upper cylindrical portion 302 but not the lower cylindrical portion 304, and the second molding compound 216 does not comprise the annular portion 306. In all embodiments, the third height h3 is greater than zero. The diameters d1 and d2 and the heights h1 to h3 may be selected to obtain the desired mixing and concentrations of molding compounds of the packaged semiconductor device.

FIGS. 4A to 4E show cross-sectional schematic diagrams of the process of molding the packaged semiconductor device 200 of FIG. 2 according to one embodiment of the present invention. Molding is performed using mold tooling 400, which comprises a plunger 402, a pot 404, a runner 406, and a mold 408.

Figure 4A:
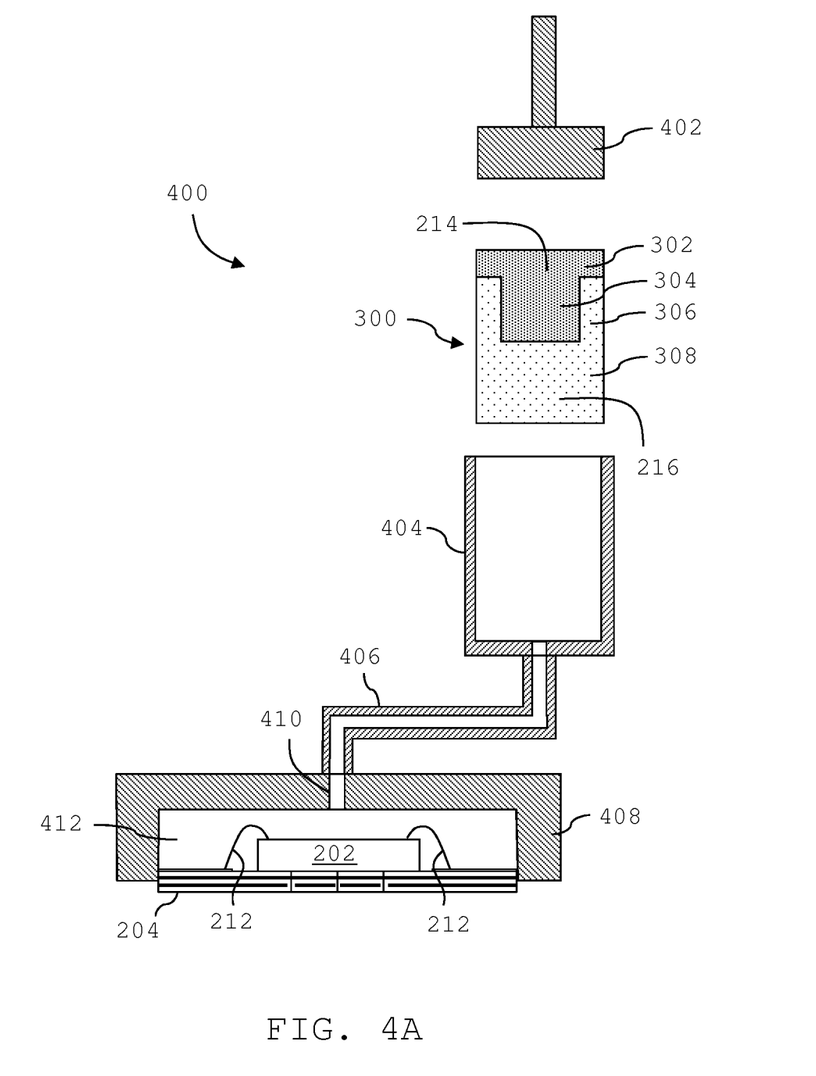
FIGS. 4A to 4E show cross-sectional schematic diagrams of the process of molding the packaged semiconductor device of FIG. 2 according to one embodiment of the present invention.

In FIG. 4A, the molding compound pellet 300 is dropped into the pot 404 of the mold tooling 400. Further, a partially-assembled packaged semiconductor device that comprises the IC die 202, the substrate 204, and the bond wires 212 is fitted into a chamber 412 of the mold 408. The mold 408 comprises a gate 410, which is positioned directly above the center of the IC die 202. In this embodiment, the IC die 402 is centered in the mold 408 and the gate 410 is a center gate, meaning that the gate is positioned in the center of the mold. Note that, in alternative embodiments of the present invention in which the IC die is not centered, the gate may be centered over the IC die but might not be centered in the mold.

Figure 4B:
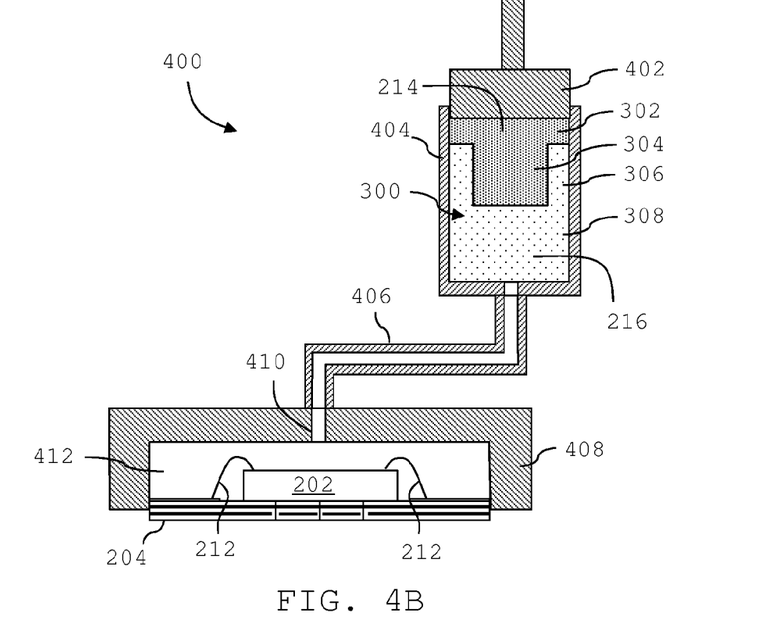

In FIG. 4B, the molding compound pellet 300 is resting in the pot 404, and the plunger 402 is brought down on top of the pellet 300. The pot 404, the runner 406, and the mold 408 are heated to allow melting of the molding compound pellet 300 as it is pushed into the chamber 412 of the mold 408. Note that, in alternative embodiments, the runner 406 may extend from the perimeter of the bottom surface of the pot 404, rather than the center of the pot 404 as shown. The pot 404 applies heat to the external surface of the molding compound pellet 300, and, as a result, the molding compound pellet 300 melts radially from its curved external surface toward its central axis.

Figure 4C:
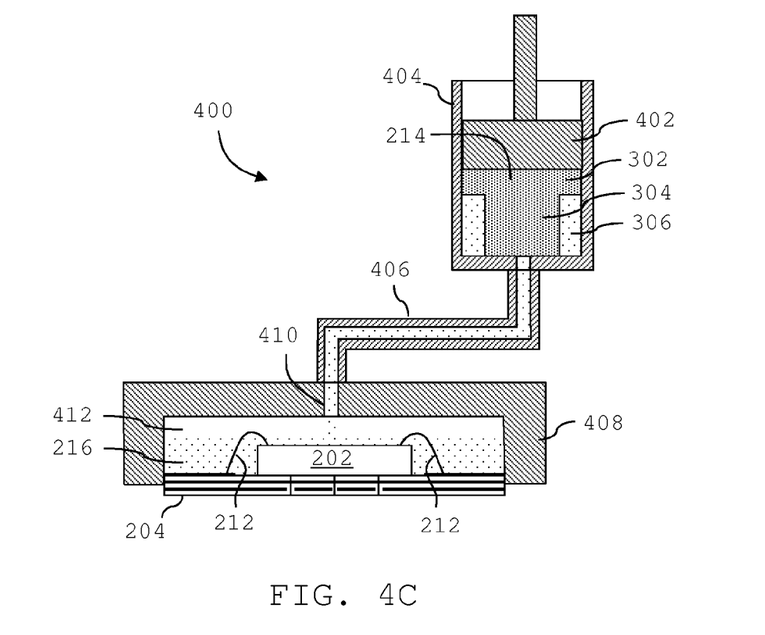

FIG. 4C shows the mold tooling 400 after the plunger 402 has pushed the cylindrical portion 308 of the second molding compound 216 into the chamber 412. This portion of the second molding compound 216 encapsulates the exposed portions of the upper surface of the substrate 204, a portion of the bond wires 212, the sides and possibly the upper surface of the IC die 202.

Figure 4D:
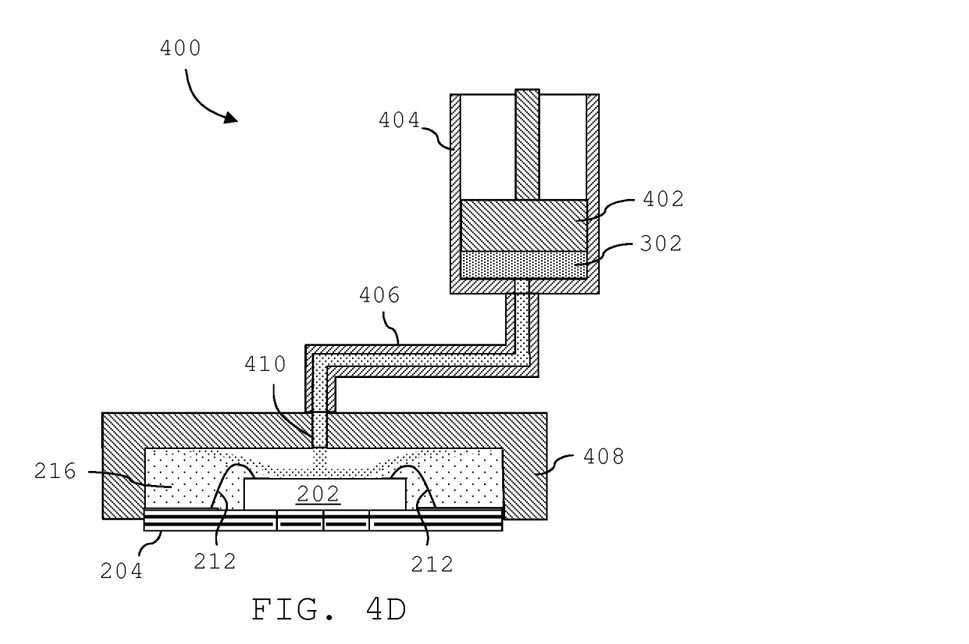

FIG. 4D shows the mold tooling 400 after the plunger 402 has pushed the annular portion 306 of the second molding compound 216 and the lower cylindrical portion 304 of the first molding compound 214 into the chamber 412. Note that, since the molding compound pellet 300 melts radially from its curved external surface toward its central axis, the annular portion 306 of the second molding compound 216 will begin melting before the cylindrical portion 304 of the first molding compound 214 begins melting. However, some mixing of the molding compounds 214 and 216 will occur, and the particular concentrations of the molding compounds 214 and 216 will vary over time. In particular, the concentration of the second molding compound 216 pressed into the chamber 412 will be higher initially and will decrease as the plunger depresses, while the concentration of the first molding compound 214 pressed into the chamber 412 will be lower initially and will increase as the plunger depresses.

The force of the molding compound being dispensed onto the upper surface of the IC die 202, and the density of the first molding compound 214, which is greater than that of the second molding compound 216, pushes the lighter second molding compound 216 away from the center of the IC die 202.

Figure 4E:
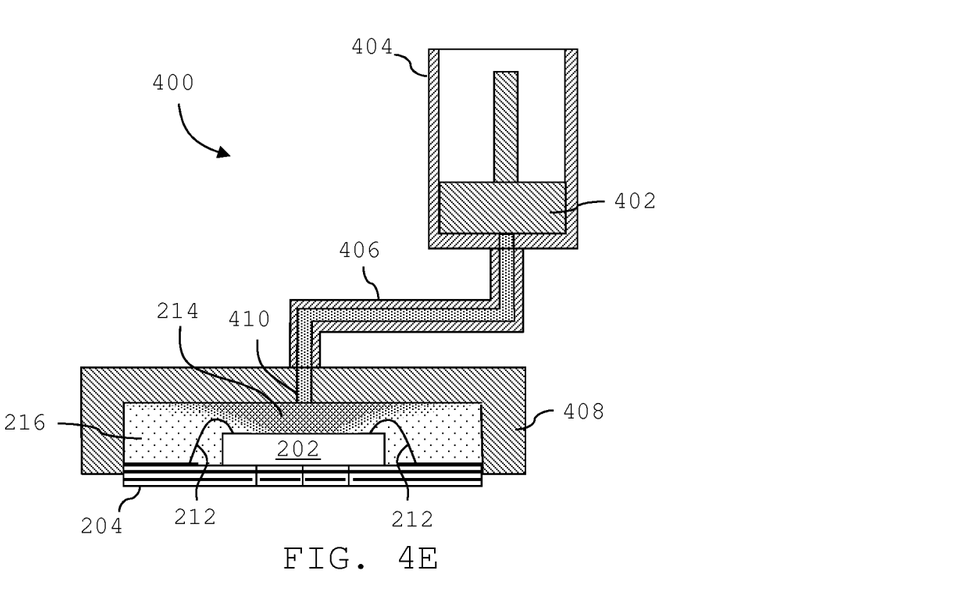

FIG. 4E shows the mold tooling 400 after the plunger 402 has pushed the upper cylindrical portion 302 of the first molding compound 214 into the chamber 412. As shown, the upper cylindrical portion 302 of the first molding compound 214 fills the remaining volume directly above the IC die 202.

FIGS. 5A to 5H show cross-sectional side views of a press 500 that illustrate steps of an exemplary method for fabricating the molding compound pellet 300 in FIG. 3 according to one embodiment of the present invention. The molding compound pellet 300 is formed using a press 500 comprising an upper press portion 502 and a lower press portion 508. The upper press portion 502 comprises an upper guide 504 having an annular shape and an upper, cylindrically-shaped pin 506. The upper pin 506 is coaxial with the upper guide 504 and slides vertically within the upper guide 504 along the shared axis.

The lower press portion 508 comprises a lower housing 510 having an annular tubular shape, a lower guide 512 also having an annular shape, and lower, cylindrical-shaped pin 514. The lower housing 510, lower guide 512, and lower pin 514 are coaxial with one another. Further, the lower pin 514 slides vertically within the lower guide 512 along the shared axis, and the lower guide 512 slides vertically within the housing 510 along the shared axis. Note that, in alternative embodiments, lower guide 512 may be eliminated and the diameter of lower pin 514 may be enlarged to fit the inner diameter of lower housing 510.

Figure 5A:
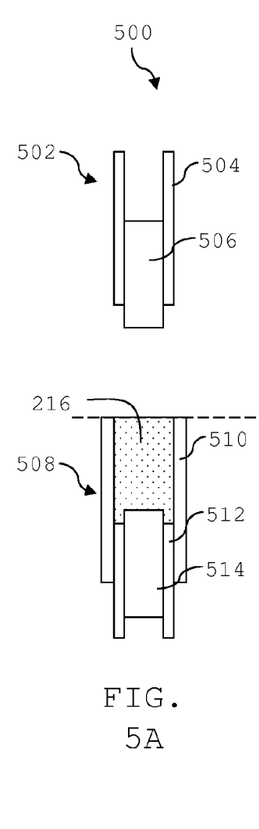
FIGS. 5A to 5H show cross-sectional side views that illustrate steps of an exemplary method for fabricating the molding compound pellet in FIG. 3 according to one embodiment of the present invention.

In FIG. 5A, the first and second press portions 502 and 508 are separated from one another. The second molding compound 216 is dispensed into the housing 510 of the lower press portion 502 in an uncured, granulate form.

Figure 5B:
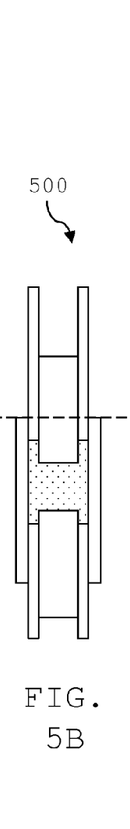

In FIG. 5B, the annular guide 504 of the upper press portion 502 is fitted into the housing 510 of the lower press portion 508. The upper press portion 502 and lower press portion 508 are forced together such that the second molding compound 216 is partially compressed. Note that the outer curved surface of the annular guide 504 fits tightly against the inner curved surface of the housing 510 so that little, if any, of the second molding compound 216 escapes from the housing 510.

Figure 5C:
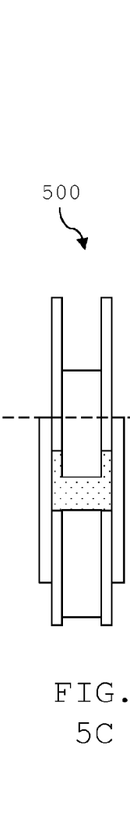

In FIG. 5C, the upper press portion 502 and lower press portion 508 are forced further together such that the second molding compound 216 is fully compressed to solidify the molding compound 216. Note that, during this step, the upper surface of the lower pin 514 becomes aligned with the upper surface of the lower guide 512. Further, the upper pin 506 of the upper press portion 502 forms a cylindrically-shaped recess 516 in the second molding compound 216 as shown in FIG. 5D.

Figure 5D:
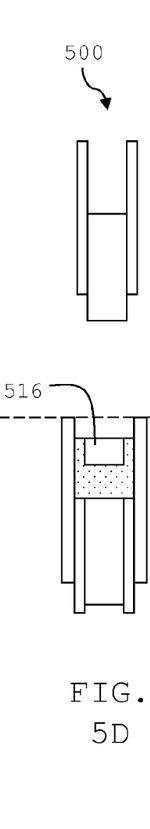
Figure 5E:
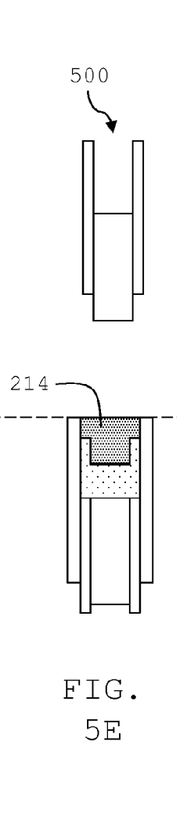

In FIG. 5D, the upper and lower press portions 502 and 508 are separated from one another, and in FIG. 5E, the first molding compound 214 is dispensed in uncured, granulate form into the housing 510 of the lower press portion 502. The first molding compound 214 fills the cylindrically-shaped recess 516 in the second molding compound 216 and the area of the housing 510 above the second molding compound 216.

Figure 5F:
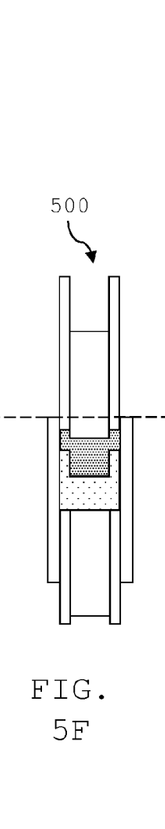
Figure 5G:
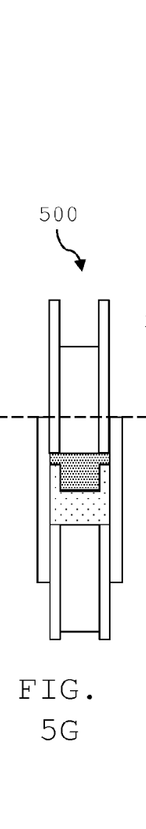

In FIG. 5F, the upper press portion 502 and lower press portion 508 are forced together to partially compress the first molding compound 214, and in FIG. 5G, the upper press portion 502 and lower press portion 508 are forced further together to fully compress the first molding compound 214. Note that, during this step, the lower surface of the upper pin 506 becomes aligned with the lower surface of the upper guide 504.

Figure 5H:
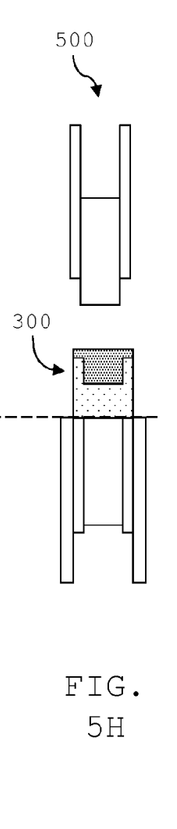

In FIG. 5H, the solidified molding compound pellet 300 is ejected from the lower press portion 508.

Figure 6:
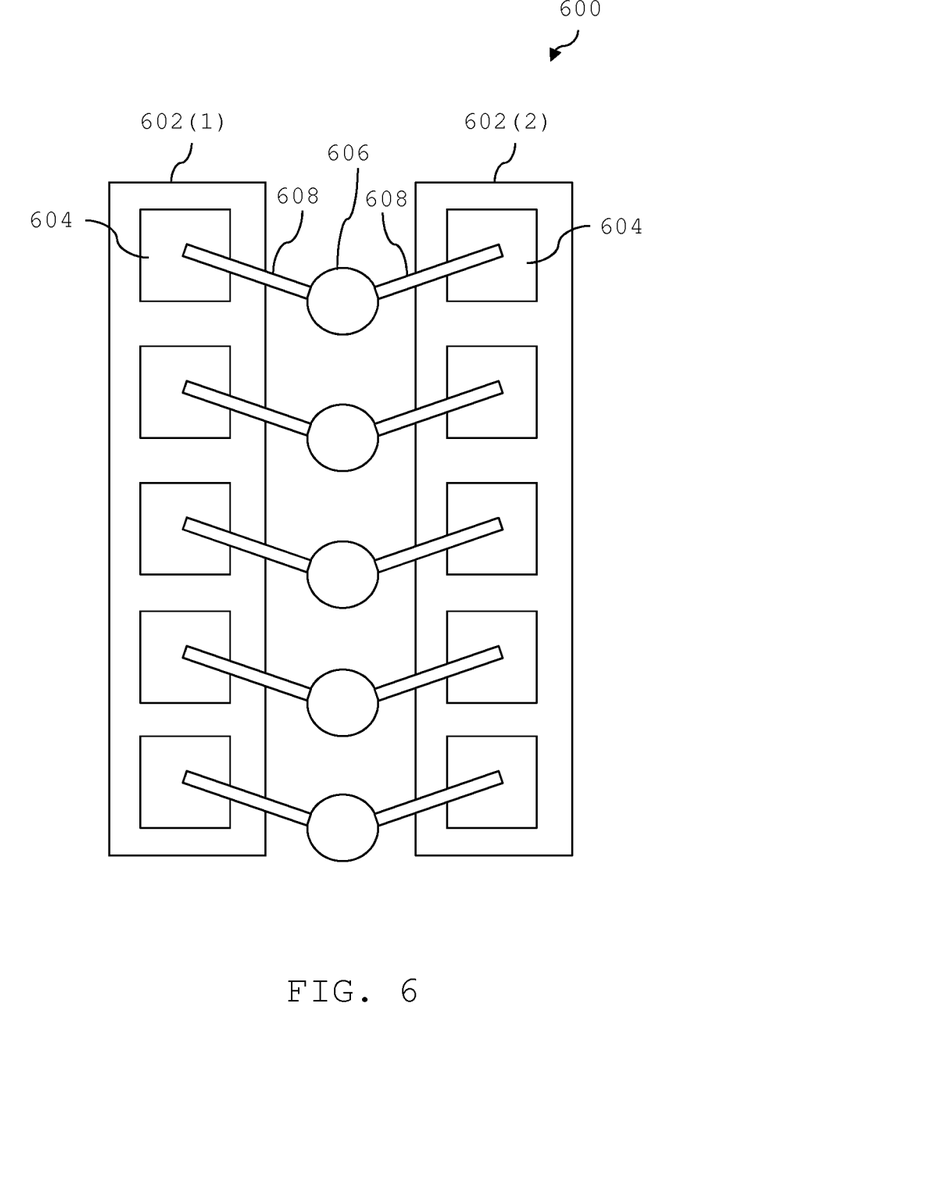
FIG. 6 shows a top view of a mold tooling according to one embodiment of the present invention that may be used to mold a plurality of instances of the packaged semiconductor device in FIG. 2 concurrently.

FIG. 6 shows a top view of mold tooling 600 according to one embodiment of the present invention that may be used to mold a plurality of instances of the packaged semiconductor device 200 concurrently. Mold tooling 600 comprises two cavity bars 602(1) and 602(2), each of which comprises five molds 604. Mold tooling 600 also comprises five pots 606, each pot 606 having a pair of runners 608 extending therefrom that feed a pair of molds 604. One runner 608 in each pair feeds a mold 604 of the first cavity bar 602(1), and the other runner in the pair feeds a mold 604 of the second cavity bar 602(2).

During molding, a molding compound pellet (not shown) is dropped into each pot 606. The molding compound pellets may be similar in appearance to the molding compound pellet 300 in FIG. 3, but are sized to accommodate the molding of two instances of the packaged semiconductor device 200 concurrently. The molding compound pellet in each pot 606 is then heated and pushed by a plunger (not shown) similar to plunger 402 in FIGS. 4A to 4E into the corresponding molds 604.

Although FIGS. 1 and 2 show only one IC die, embodiments of the present invention are not so limited. Alternative embodiments of the present invention may comprise more than one IC die in a stacked and/or non-stacked arrangement.

Further, although FIGS. 1 and 2 show embodiments in which the IC dies are mounted onto substrates, embodiments of the present invention are not so limited. In alternative embodiments of the present invention, the IC dies may be mounted onto lead frames.

Yet further, although FIGS. 1 and 2 show embodiments in which the IC dies are electrically connected to substrates using bond wires, embodiments of the present invention are not so limited. In alternative embodiments of the present invention, the IC dies may be electrically connected to substrates or lead frames using other interconnects, including flip-chip bumps.

Even yet further, although embodiments of the present invention have been described as comprising a first molding compound (e.g., 114 and 214), which has (i) a higher thermal conductivity, (ii) a higher viscosity, and (iii) a higher elastic modulus than a second molding compound (e.g., 116 and 216), embodiments of the present invention are not so limited. According to alternative embodiments of the present invention, the first molding compound may have any combination of one or more of these properties.

Even yet still further, although one embodiment of the present invention was shown as being molded using a cylindrically-shaped pellet (e.g., 300 of FIG. 3), embodiments of the present invention are not so limited. According to alternative embodiments, the pellet may have another suitable shape. In addition, the portion of the first molding compound (e.g., 304 of FIG. 3B) that lies within the second molding compound may have a suitable shape other than a cylinder (e.g., a cone).

According to alternative embodiments of the present invention, the first molding compound may cover the entire upper surface of the IC die, rather than just a portion of the upper surface as shown in FIGS. 1 and 2.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The invention claimed is:

1. A method for assembling a packaged semiconductor device, the method comprising:
    (a) positioning a partially-assembled packaged semiconductor device comprising an integrated circuit (IC) die within a mold cavity;
    (b) positioning a molding compound pellet within a pot, wherein the molding compound pellet comprises a first molding compound and a second molding compound different from the first molding compound;
    (c) pushing the second molding compound into a second volume of the mold cavity disposed on a second side of the IC die; and (d) pushing the first molding compound into a first volume of the mold cavity disposed on at least a first portion of a first side of the IC die, different from the second side, and after step (c) and before step (d), pushing a mixture of the first and second molding compounds from the first and second regions into a third volume of the mold cavity, wherein the molding compound pellet comprises (i) a first region comprising the first molding compound and (ii) a second region comprising the second molding compound and a recess, wherein the first region is located within the recess of the second region.

2. The method of claim 1, wherein:

the first portion is within a perimeter of the IC die; and the second volume is further disposed on a second portion of the first side of the IC die, wherein the second portion comprises the perimeter of the IC die.

3. The method of claim 1, wherein the third volume is situated between the first and second volumes.

4. The method of claim 3, wherein the mixture is pushed into the third volume such that:

a concentration of the first molding compound in the mixture is highest nearest to a center of the IC die and decreases away from the center of the IC die; and a concentration of the second molding compound in the mixture is highest away from the center of the IC die and decreases toward the center of the IC die.

5. The method of claim 1, wherein the first volume has a substantially conical, frustum shape.

6. The method of claim 1, wherein the first molding compound comprises one or more of the following properties:

(i) a higher thermal conductivity than the second molding compound;

(ii) a higher viscosity at molding temperature than the second molding compound; and (iii) a higher elastic modulus than the second molding compound.

7. The method of claim 1, wherein:

the molding compound pellet further comprises a third region comprising the first molding compound, wherein the third region is in a stacked arrangement with the first and second regions; and step (d) comprises pushing the third region into the mold cavity.

8. The method of claim 7, wherein:

the molding compound pellet further comprises a fourth region comprising the second molding compound, wherein the fourth region is in a stacked arrangement with the first and second regions, opposite the third region; and step (c) comprises pushing the fourth region into the mold cavity.

9. The method of claim 7, wherein:

the molding compound pellet further comprises a third region comprising the second molding compound, wherein the third region is in a stacked arrangement with the first and second regions; and step (c) comprises pushing the third region into the mold cavity.

* * * * *